(12) United States Patent
Nakai et al.

(10) Patent No.: US 10,741,727 B2
(45) Date of Patent: Aug. 11, 2020

(54) LIGHT EMITTING DEVICE AND METHOD OF MANUFACTURING SAME

(71) Applicant: Nichia Corporation, Anan-shi, Tokushima (JP)

(72) Inventors: Hiroki Nakai, Anan (JP); Kensuke Yamaoka, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 16/203,459

(22) Filed: Nov. 28, 2018

(65) Prior Publication Data
US 2019/0165218 A1  May 30, 2019

(30) Foreign Application Priority Data

Nov. 30, 2017  (JP) ................................. 2017-230917

(51) Int. Cl.
*H01L 33/48* (2010.01)
*H01L 25/075* (2006.01)
(Continued)

(52) U.S. Cl.
CPC ........ *H01L 33/483* (2013.01); *H01L 25/0753* (2013.01); *H01L 33/507* (2013.01);
(Continued)

(58) Field of Classification Search
CPC ... H01L 33/483; H01L 33/486; H01L 33/505; H01L 33/507; H01L 33/60; H01L 2933/0041; H01L 25/0753
See application file for complete search history.

(56) References Cited

U.S. PATENT DOCUMENTS

2012/0235169 A1* 9/2012 Seko ....................... H01L 33/60
257/88
2013/0033169 A1* 2/2013 Ito .......................... H01L 33/505
313/502
(Continued)

FOREIGN PATENT DOCUMENTS

JP 2009-218274 A 9/2009
JP 2010-157638 A 7/2010
(Continued)

*Primary Examiner* — David C Spalla
(74) *Attorney, Agent, or Firm* — Foley & Lardner LLP

(57) ABSTRACT

A light emitting device includes: a substrate; a light emitting element disposed on the substrate; a light transmissive member having a plate shape and having an upper face and a lower face disposed such that the lower face opposes a light emission face of the light emitting element; a light reflecting member covering lateral faces of the light emitting element and lateral faces of the light transmissive member; and a light shielding frame disposed on the upper face of the light reflecting member surrounding the light transmissive member. The light shielding frame has an opening, an inner perimeter of the opening is positioned at a distance apart from an outer perimeter of the upper face of the light transmissive member in a plan view as seen from above, and the light reflecting member is interposed between the inner perimeter of the opening and the outer perimeter of the upper face of the light transmissive member.

17 Claims, 6 Drawing Sheets

(51) Int. Cl.
*H01L 33/50* (2010.01)
*H01L 33/60* (2010.01)
*H01L 33/52* (2010.01)
*F21S 41/151* (2018.01)
*H01L 33/62* (2010.01)

(52) U.S. Cl.
CPC .............. *H01L 33/52* (2013.01); *H01L 33/60* (2013.01); *F21S 41/151* (2018.01); *H01L 33/486* (2013.01); *H01L 33/62* (2013.01); *H01L 2933/0033* (2013.01); *H01L 2933/0041* (2013.01); *H01L 2933/0058* (2013.01); *H01L 2933/0066* (2013.01)

(56) References Cited

U.S. PATENT DOCUMENTS

| | | | | |
|---|---|---|---|---|
| 2014/0175491 A1* | 6/2014 | Sanga | ................... | H01L 33/505 |
| | | | | 257/98 |
| 2014/0203306 A1* | 7/2014 | Ito | ......................... | H01L 33/505 |
| | | | | 257/88 |
| 2015/0009453 A1* | 1/2015 | Cha | ...................... | G02B 6/0001 |
| | | | | 349/65 |
| 2015/0207045 A1 | 7/2015 | Wada et al. | | |
| 2016/0079486 A1* | 3/2016 | Sugimoto | ........... | H01L 25/0753 |
| | | | | 257/88 |
| 2016/0093780 A1 | 3/2016 | Beppu et al. | | |
| 2016/0190418 A1* | 6/2016 | Inomata | ................. | H01L 33/502 |
| | | | | 257/98 |
| 2017/0018694 A1 | 1/2017 | Emura et al. | | |
| 2017/0125644 A1 | 5/2017 | Tsuchiya et al. | | |
| 2017/0155022 A1* | 6/2017 | Tomonari | ............. | H01L 33/54 |
| 2017/0317251 A1 | 11/2017 | Sweegers et al. | | |
| 2018/0090649 A1* | 3/2018 | Nishioka | ................. | H01L 33/54 |
| 2018/0123005 A1* | 5/2018 | Ozeki | ................. | H01L 25/0753 |

FOREIGN PATENT DOCUMENTS

| | | |
|---|---|---|
| JP | 2010-219324 A | 9/2010 |
| JP | 2010-283281 A | 12/2010 |
| JP | 2011-134829 A | 7/2011 |
| JP | 2012-059939 A | 3/2012 |
| JP | 2014-127679 A | 7/2014 |
| JP | 2015-026871 A | 2/2015 |
| JP | 2015-138838 A | 7/2015 |
| JP | 2017-028265 A | 2/2017 |
| JP | 2017-092092 A | 5/2017 |
| JP | 2017-183300 A | 10/2017 |
| JP | 2017-533590 A | 11/2017 |
| JP | 2018-056268 A | 4/2018 |

\* cited by examiner

LIGHT EMITTING DEVICE AND METHOD OF MANUFACTURING SAME

CROSS-REFERENCE TO RELATED APPLICATION

This application claims priority to Japanese Patent Application No. 2017-230917, filed on Nov. 30, 2017, the disclosure of which is hereby incorporated by reference in its entirety.

BACKGROUND

The present disclosure relates to a light emitting device and a method of manufacturing the same.

High output light emitting devices constructed with light emitting elements such as LEDs have been used as light sources in the automotive applications, and the like. For example, Japanese Patent Publication No. 2014-127679 discloses a high output light emitting device for use as an automotive light source having enhanced heat dissipation performance by virtue of a heat dissipation layer formed so as to cover the periphery of the light emission face of the light emitting element. According to the Japanese Patent Publication No. 2014-127679, the light emitting device disclosed therein can achieve sharp-edged light distribution characteristics in addition to improved heat dissipation properties because of the heat dissipation layer formed to cover the periphery of the light emission face of the light emitting element, which is said to be suited, for example, for automotive headlamp applications. Here, the sharp-edged light distribution in that patent publication is understood that there is a large luminance difference between the inside and the outside of the light emission surface.

However, there is a need for more efficient extraction of light emitted from light emitting elements in the light emitting devices for use as high output light sources for automotive applications and the like.

Accordingly, one object of the present disclosure is to provide a light emitting device achieving a large luminance difference between the inside and the outside of the light emission surface as well as efficient extraction of the light emitted by the light emitting elements.

According to one embodiment, a light emitting device includes: a substrate, a light emitting element disposed on the substrate, a light transmissive member having a plate shape and having an upper face and a lower face disposed such that the lower face opposes a light emission face of the light emitting element, a light reflecting member covering lateral faces of the light emitting element and lateral faces of the light transmissive member, and a light shielding frame disposed on the upper face of the light reflecting member surrounding the light transmissive member, wherein the light shielding frame has an opening, an inner perimeter of the opening is positioned at a distance apart from an outer perimeter of the upper face of the light transmissive member in a plan view as seen from above, and the light reflecting member is interposed between the inner perimeter of the opening and the outer perimeter of the upper face of the light transmissive member.

The method of manufacturing a light emitting device according to certain embodiment of the present includes: mounting a light emitting element on a substrate, bonding a light transmissive member having a plate shape such that a lower face of the light transmissive member faces a light emission face of the mounted light emitting element, forming a resin wall having upper end higher than an upper face of the light transmissive member in locations at a predetermined distance apart from the light emitting element and the light transmissive member and interposed by the light emitting element and the light transmissive member while maintaining flexibility to be deformed by pressing force, disposing a light shielding frame having an opening at a predetermined height from the substrate by pressing the light shielding frame to be in contact with the upper end of the resin wall such that an inner perimeter of the opening is positioned on or outward of the outer perimeter of the upper face of the light transmissive member, and forming a light reflecting member that surrounds the light emitting element and the light transmissive member between the substrate and the light shielding frame by supplying s light reflecting resin into a space between the substrate and the light shielding frame.

The light emitting device according to certain embodiments of the present disclosure can achieve a large luminance difference between the inside and the outside of the light emission surface as well as efficient extraction of the light emitted by the light emitting element.

The method of manufacturing a light emitting device according to certain embodiment of the present disclosure can allow for manufacture of a light emitting device achieving a large luminance difference between the inside and the outside of the light emission surface as well as efficient light extraction of the light emitted by the light emitting element.

DETAILED DESCRIPTION

The present inventors have considered how to obtain a light emitting device achieving a large luminance difference between the inside and the outside of the light emission surface. Here, in order to provide a light emitting device, a light emitting element may be mounted on a substrate. A palate-shape light-transmitting member may be disposed on the light emission face of the light emitting element. The lateral faces of the light emitting element and the lateral faces of the light transmissive member may be covered with a light reflecting member. This may provide a light emitting device capable of efficiently extracting light emitted from the lateral faces of the light emitting element and the lateral faces of the light transmissive member in an upward direction. A light shielding frame may be disposed in contact with the outer perimeter of the light transmissive member on the upper face of the light reflecting member surrounding of the light emitting element and the light transmissive member so that there is a large luminance difference between the inside and the outside of the light emission face in the prepared light emitting device. In this case, it would be expected that the luminance difference between the inside and the outside of the light emission face would be increased.

It is believed, however, that disposing the light shielding frame on the upper face of the light reflecting member surrounding the light emitting element and the light transmissive member would reduce the light extraction efficiency as compared to a light emitting device without a light shielding frame. Specifically, it is believed that the reduction in light extraction efficiency would be caused by the absorption of light by the light shielding frame. That is, the light shielding frame disposed to increase the luminance difference between the inside and outside of the light emission face has the property of absorbing light, and the absorption of light by the light shielding frame positioned in the vicinity of the contact portions of the light transmissive member and the light shielding frame reduces the light extraction efficiency. Accordingly, the present inventors produced a light emitting device in which a light reflecting member was disposed between the light transmissive member and the light shielding frame in order to attenuate the reduction of the light extraction efficiency.

The present disclosure is created based on the findings independently obtained by the present inventors described above.

Embodiments of light emitting devices and methods for manufacturing the same will be explained below with reference to the drawings.

Light Emitting Devices According to Embodiments

Figure 1:
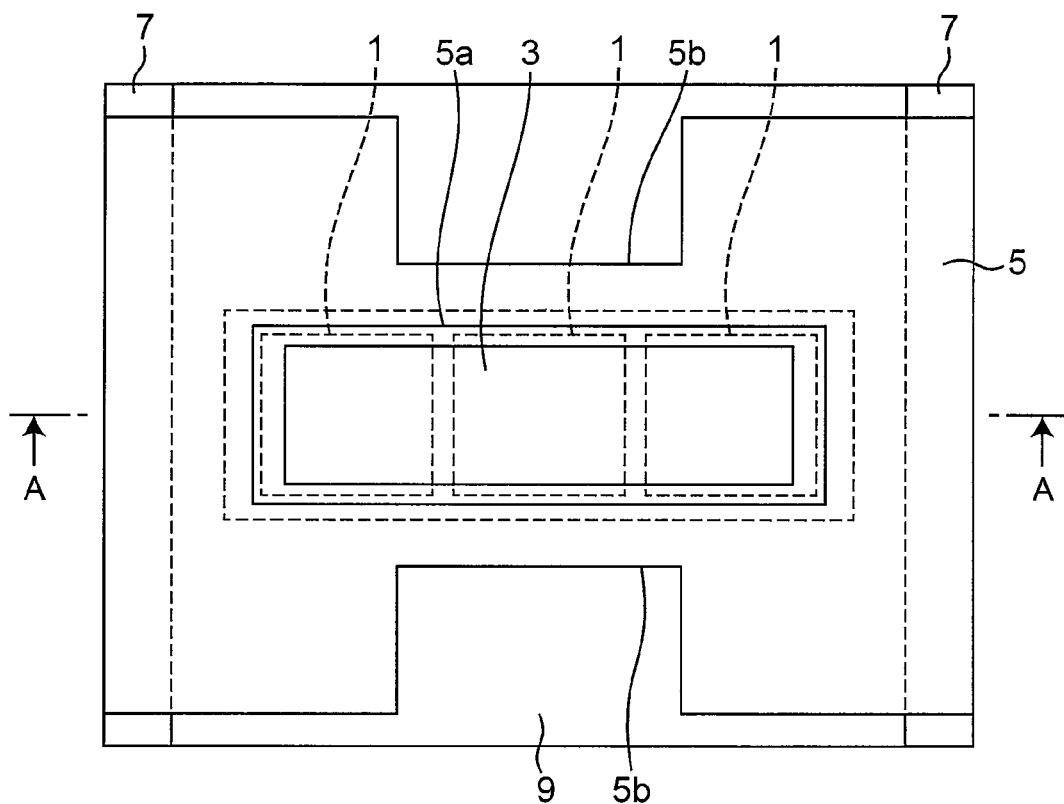
FIG. 1 is a plan view of the light emitting device according to certain embodiment of the present disclosure.
Figure 2:
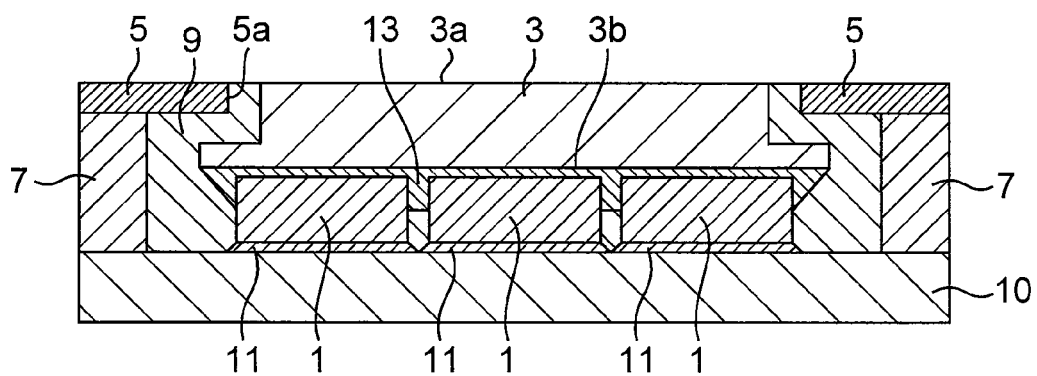
FIG. 2 is a cross-sectional view taken along line A-A in FIG. 1.

As shown in FIG. 1 and FIG. 2, the light emitting device according to the present embodiment includes a substrate 10, one or more light emitting elements 1 disposed on the substrate 10, a plate-shaped light transmissive member 3 disposed so that its lower face faces a light emission face of the light emitting elements 1, and a light reflecting member 9 disposed to cover lateral faces of the light emitting elements 1 and lateral faces of the light transmissive member 3 while exposing the upper face 3a of the light transmissive member 3, which is a light emission surface of the light emitting device. In the light emitting device according to the present embodiment, the light shielding frame 5 having an opening 5a is disposed on the upper face of the light reflecting member 9 surrounding of the light transmissive member 3 so that the upper face 3a of the light transmissive member 3 is positioned on or inward of the opening 5a, and the upper face 3a of the light transmissive member 3 is exposed from the light reflecting member 9 and the light shielding frame 5.

In the light emitting device according to the present embodiment, in particular, the inner perimeter of the opening 5a is positioned apart from the outer perimeter of the light emission surface (i.e., the upper face of the light transmissive member 3), and the light reflecting member 9 is exposed between the inner perimeter of the opening 5a and the outer perimeter of the light emission surface 3a in a plan view as seen from above (i.e., from the light emission face 3a side). In this manner, on the upper face of the light emitting device, the light emission surface 3a is separated from the inner perimeter of the opening of the light shielding frame 5 by interposing the surface of the light reflecting member. Also, the lateral faces of the light emitting elements 1 and the lateral faces of the light transmissive member 3 are separated from the light shielding frame 5 by interposing the light reflecting member 9.

The light emitting device according to the present embodiment structured as above can achieve the large luminance difference between the light emission surface 3a and the area surrounding the light emission surface 3a, and allows for efficient extraction of the light emitted by the light emitting elements. In the light emitting device according to the present embodiment, the spacing between the inner perimeter of the opening 5a and the outer perimeter of the light emission surface 3a is preferably set to at least 5 μm and 150 μm at most, more preferably at least 40 μm and 60 μm at most, in order to achieve both objects: a large luminance difference between the inside and the outside of the light emission surface 3a; and efficient extraction of the light emitted by the light emitting elements.

Various embodiments of the light emitting device according will be explained below.

Embodiment 1

In the light emitting device according to the embodiment, the area of the lower face 3b of the light transmissive member 3 is larger than the area of the upper face 3a (i.e., the light emission surface of the light emitting device) of the light transmissive member 3.

By making the area of the upper face 3a of the light transmissive member 3 smaller than that of the lower face 3b, the light entering the lower face 3b of the light transmissive member 3 can exit from the upper face 3a (i.e., the light emission surface of the light emitting device) that is a smaller area. That is, this can realize a high luminance light emitting device that light emitted from the light emitting element transmits through the light transmissive member 3 having a narrowed light emission surface area. Accordingly, such a light emitting device can illuminate at a greater distance. A light emitting device having high front luminance is particularly suited for automotive lighting such as headlights. There are various regulations or standards related to the colors of automotive lighting, for example, the color of front lamps (e.g., headlights) must be white or light yellow, and all of them must have the same color.

Figure 6:
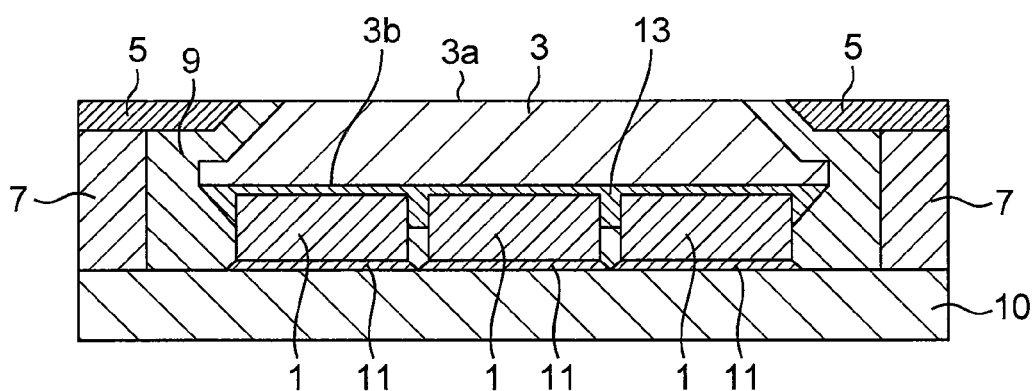
FIG. 6 is a cross-sectional view of the light emitting device according to variation 4 of the embodiment.

Furthermore, the outer perimeter of the lower face 3b of the light transmissive member 3 is preferably positioned outward of the inner perimeter of the opening 5a of the light shielding frame 5 in a plan view as seen from above. In this case, the lateral faces of the light transmissive member 3 may have stepped portions so as to form collars having a certain thickness as shown in the schematic diagrams such as FIG. 2, or may have oblique faces in part or whole as shown in FIG. 6. In the case in which the lateral faces of the light transmissive member 3 are oblique faces, the oblique surfaces may be flat or curved surfaces.

Positioning the outer perimeter of the lower face 3b of the light transmissive member 3 on the outside of the inner perimeter of the opening 5a in a plan view as seen from above, and positioning the outer perimeter of the upper face 3a of the light transmissive member 3 on the inside of the inner perimeter of the opening 5a in a plan view as seen from above in this manner can achieve the effect described below.

That is, in a plan view as the light emitting device is seen from above (i.e., from the light emission face side), the upper face 3a of the light transmissive member 3 and the upper face of the light reflecting member 9 that surrounds the outer perimeter of the upper face 3a of the light transmissive member 3 can be visually recognized in the opening 5a. At this point, in the region on the inside of the opening 5a, the oblique faces and/or the collars of the light transmissive member 3 are located under the light reflecting member 9. Accordingly, even if light leaks from the opening 5a due to a crack or delamination in the light reflecting member 9, the leaked light can be limited to only that transmit through the light transmissive member 3. Furthermore, because the light leaking from the light reflecting member is shielded in the region covered by the light shielding frame 5, even if a crack or delamination occurs in the light reflecting member 9 located along the lateral faces of the light emitting element 1, for example, the light from the lateral faces of the light emitting element 1 is less likely to travel through a crack or delaminated location towards the light emission surface by light leakage. For example, a light emitting device that emits white light by mixing blue light emitted by the light emitting element 1 and yellow light resulting from converting the wavelength of a portion of the blue light can be applied as automotive lighting. In this case, if the blue light emitted by the light emitting element 1 leaks out, in addition to the white light emitted from the light emission surface, a chromaticity difference would result in the opening 5a, which might allow for emission color variance to occur in the irradiated area. Furthermore, if the leaked blue light is visually recognized, the regulations or standards for automotive lighting described above would not be satisfied, and might compromise the safety of the vehicle.

Embodiment 2

In the light emitting device according to the embodiment, the outer perimeter of the upper face 3a of the light transmissive member 3 is preferably positioned on or inward of the outer perimeter of the light emitting elements 1 in a plan view as seen from above. In the case in which a plurality of light emitting elements 1 are included in the light emitting device as shown in FIG. 1, the outer perimeter of the light emitting elements 1 is defined as the outer perimeter of the plurality of light emitting elements 1 as a whole, excluding the outer perimeter portions positioned between adjacent ones of light emitting elements.

In this manner, the light from the plurality of light emitting elements 1 can be collected and emitted from the upper face 3a of the light transmissive member 3. Accordingly, light emitted from the light emitting elements 1 can exit from the upper face (i.e., the light emission surface) of the light transmissive member 3 with higher density of luminous flux.

Embodiment 3

Figure 3:
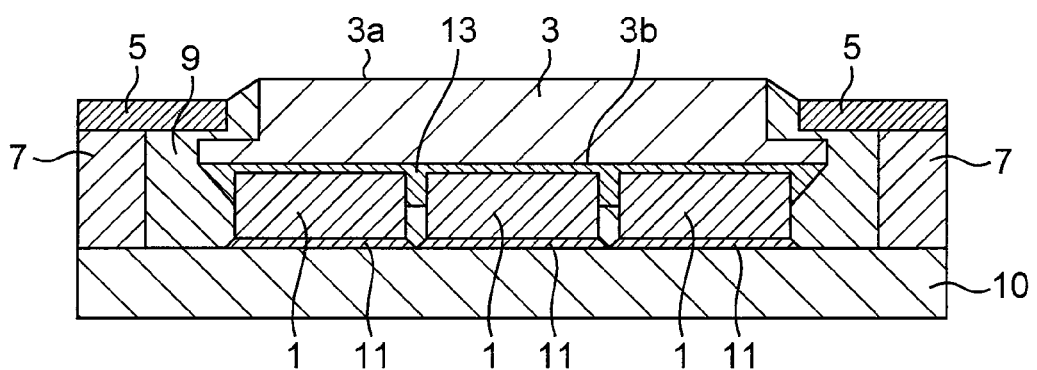
FIG. 3 is a cross-sectional view of the light emitting device according to variation 1 of the embodiment.
Figure 4:
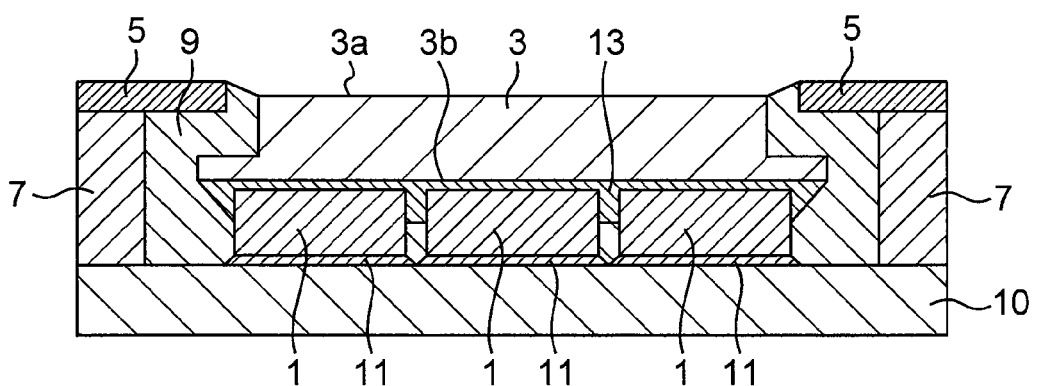
FIG. 4 is a cross-sectional view of the light emitting device according to variation 2 of the embodiment.

In the light emitting device according to the embodiment, the upper face 3a of the light transmissive member 3 and the upper face of the light shielding frame 5 may be coplanar as shown in FIG. 2, or may be positioned in different planes as shown in FIG. 3 and FIG. 4. In the case in which the upper face 3a of the light transmissive member 3 and the upper face of the light shielding frame 5 are positioned in different planes, the different planes are preferably in parallel to one another. In the case in which the upper face 3a of the light transmissive member 3 and the upper face of the light shielding frame 5 are not coplanar, regardless of whether the upper face 3a of the light transmissive member 3 is higher or lower than the upper face of the light shielding frame 5, the light reflecting member 9 is preferably disposed to cover the lateral faces of the light emitting elements 1 and the lateral faces of the light transmissive member 3 while exposing the upper face 3a of the light transmissive member 3, which is the light emission surface of the light emitting device.

Embodiment 4

In the light emitting device according to the embodiment, the light shielding frame 5 may be disposed so that the outer perimeter of the light shielding frame 5 coincides with the outer perimeter of the light emitting device, but the outer perimeter of the light shielding frame 5 is preferably positioned on or inward of the outer perimeter of the light emitting device. In this way, the light shielding frames will not be present on the dividing lines where light emitting devices are divided into individual units (i.e., individual light emitting devices) in the dividing step described later. Thus, the light shielding frames or the like is less likely to be displaced when divided into individual units.

Here, the structure referred to as "the outer perimeter of the light shielding frame 5 being positioned on or inward of the outer perimeter of the light emitting device" includes an instance where the light shielding frame 5 is disposed so that a portion of the outer perimeter of the light shielding frame 5 is positioned on or inward of the outer perimeter of the light emitting device.

The width of the light shielding frame in a plan view is preferably at least 130 µm so that the luminance difference between the inside and the outside of the light emission surface 3a becomes large. Considering the ease of handling in the manufacturing process, the width is more preferably at least 500 µm. The width of the light shielding frame may be constant along the entire perimeter, but may vary in part. In the case of varying the width of the light shielding frame, the width is preferably at least 130 µm across the entire perimeter and partially at least 500 µm.

Each constituent element of the light emitting device according to the embodiment will be explained below.

Substrate 10

The substrate 10 is a member that supports light emitting elements 1, and, while not shown in the schematic diagrams, has a wiring pattern to be electrically connected to the external electrodes of the light emitting elements 1. The primary material for the substrate 10 is preferably an insulation material that is less likely to transmit the light from the light emitting elements 1 as well as light from the outside.

Specific examples include: ceramics, such as alumina and aluminum nitride; and resins, such as phenol resins, epoxy resins, polyimide resins, BT resin, polyphthalamide, and the like. In the case of using a resin, inorganic fillers, such as glass fibers, silicon oxide, titanium oxide, alumina, or the like, may be mixed into the resin as needed. This can reinforce the mechanical strength, reduce the thermal expansion coefficient, and increase the reflectance. The substrate 10 may be one constructed by forming an insulation material on the surface of a metal material. The wiring having a predetermined pattern is formed on the insulation material. For the wiring material, at least one selected from gold, silver, copper, and aluminum can be used. The wiring pattern may be formed by plating, vapor deposition, sputtering or the like.

Light Emitting Element 1

For the light emitting element 1, a light emitting diode is preferably used. A light emitting element having a given wavelength can be selected. For example, a blue or green light emitting element, one employing a nitride semiconductor ($In_XAl_YGa_{1-X-Y}N$, $0 \leq X$, $0 \leq Y$, $X+Y \leq 1$), ZnSe, GaP or the like can be used. For a red light emitting element, GaAlAs, AlInGaP, or the like can be used. Furthermore, a semiconductor light emitting element comprising materials other than the above can alternatively be made. The compositions, emission colors, sizes, and the number of light emitting elements used can be suitably selected depending on the purpose. In the case of including a phosphor in the light emitting device, a nitride semiconductor ($In_XAl_YGa_{1-X-Y}N$, $0 \leq X$, $0 \leq Y$, $X+Y \leq 1$) capable of emitting short wavelength light to efficiently excite the phosphor can be used. The emission wavelength can be selected by varying the semiconductor layer materials and the mixed crystal ratio.

The light emitting elements 1 used in the light emitting device according to the embodiment, for example, include positive and negative electrodes on the same face, which are flip-chip mounted on a substrate 10 so that the positive and negative electrodes are connected via conductive bonding members 11 as shown in FIG. 2. FIG. 2 shows the electrodes of the light emitting elements 1 in a simplified manner without distinguishing the positive and negative electrodes, but in reality, the positive and negative electrodes formed on the same face are disposed to be electrically separated, and the electrically separated positive and negative electrodes are individually connected to the positive and negative wires disposed on the substrate 10 via the conductive bonding members 11. The upper faces of the light emitting elements 1, which oppose the lower faces where the electrodes are formed, serve as the primary light emission faces. Because such a light emitting element 1 is connected to the substrate using conductive bonding members, such as bumps or conductive paste, as described above, contact areas between the electrodes and the substrate can be increased, thereby reducing contact resistance, as compared to a light emitting element that is connected using electric wires or the like.

The light emitting element 1, for example, is a light emitting element having a stack of nitride semiconductor layers formed on a light transmissive sapphire growth substrate. The sapphire substrate is the upper face side of the light emitting element 1, serving as the primary light emission surface. The growth substrate can be removed, for example, by polishing, LLO (laser lift off), or the like.

Light Shielding Frame 5

The light shielding frame 5 is a member disposed for reducing the luminance of the portion of the upper face of the light emitting device excluding the light emission surface. In order to reduce the luminance of the portion excluding the light emission surface, the light leaking from the light reflecting member 9 needs to be shielded. Considering this functionality, the light shielding frame 5 is preferably constructed with, for example, a member comprising a material that reflects and/or absorbs light without transmitting light, or a member equipped with a film comprising a material that reflects and/or absorbs light without transmitting light on the surface.

The material for constructing the light shielding frame 5 can be selected from resins (including fiber reinforced resins), ceramics, glass, paper, metals, and composite materials comprising two or more of these materials. Specifically, the light shielding frame 5 is preferably constructed with, for example, a metal frame comprising a metal or a frame having a metal film on the surface, that is a material having light shielding properties and is not prone to degradation. Examples of metal materials include copper, iron, nickel, chromium, aluminum, gold, silver, titanium, or their alloys. The light shielding frame 5 preferably has the functionality of attenuating reflection of the external light, and it is preferable to use a material having a high light absorption at least at the surface on the light emission surface side.

The thickness of the light shielding frame 5 (i.e., the height from the lower face to the upper face of the light shielding frame 5) is preferably about 20 µm to about 200 µm, more preferably about 30 µm to about 80 µm to achieve the light weight and resistance to deformation while maintaining the mechanical strength when the light emitting device is in use.

As described in detail later, in the manufacturing process, a material for constructing the light reflecting member 9 is injected into the space defined by one or more resin walls 7 and the substrate 10 while supporting the light shielding frame 5 with the resin walls 7. For this reason, it is preferable to provide recesses or projections in the portions of the lower face of the light shielding frame 5 in contact with the resin walls 7. This way, the resin for constructing the resin walls 7 can be injected into and hardened in the recesses can firmly fix the light shielding frame 5 and the resin walls 7. By forming the recesses or protrusions in the portions of the light shielding frame 5 in contact with resin walls 7 and hardening the resin that forms the resin walls 7 therein, the light shielding frame 5 is less likely to delaminate even after manufacturing. The upper face of the light shielding frame is preferably flat to make the light reflecting member 9 creep up.

The resin walls 7 are disposed outward of the light reflecting member 9, for example, so as to surround the light reflecting member 9 or face each other while being interposed by the light reflecting member 9. Furthermore, the light shielding frame 5 may be provided with a depression 5b depressed inward at a portion of its outer perimeter. In this way, the material for constructing the light reflecting member 9 can be injected into the space between the resin walls 7 and the substrate 10 via the depression 5b during manufacturing. The surface of the light reflecting member 9 may be exposed at the depression 5b.

Figure 5:
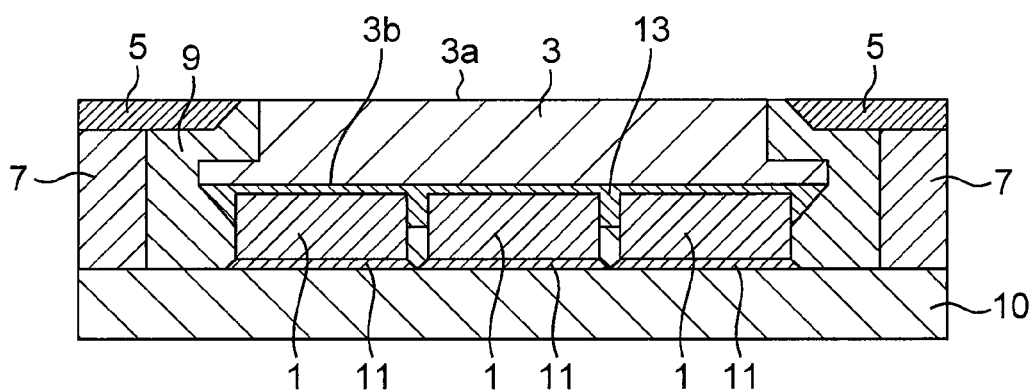
FIG. 5 is a cross-sectional view of the light emitting device according to variation 3 of the embodiment.

The inner perimeter end faces of the opening of the light shielding frame 5 may be oblique as shown in FIG. 5 and FIG. 6.

Light Transmissive Member 3

The light transmissive member 3 is a member that transmits and externally releases the light emitted from the light emitting elements 1. The light transmissive member 3 may contain a diffuser as well as a phosphor that can convert the wavelength of at least a portion of the light entering thereto. The light transmissive member 3 can be formed with, for example, a resin, glass, inorganic material, or the like. A phosphor-containing light transmissive member can be, for example, a sintered body of a phosphor, or a phosphor-containing resin, phosphor-containing glass, phosphor-containing ceramic, or another inorganic material in which phosphor is contained. Alternatively, a phosphor-containing resin layer may be formed on the surface of a resin, glass, ceramic, or another inorganic material. The thickness of the light transmissive member 3, for example, is about 50 μm to about 300 μm.

Bonding between the light transmissive member 3 and the light emitting elements can be achieved, for example, via a light guide member 13 as shown in FIG. 2. The light transmissive member 3 may be bonded to the light emitting elements 1 by using a direct bonding method, such as pressure bonding, sintering, surface activated bonding, atomic diffusion bonding, or hydroxyl group bonding, instead of using a light guide member 13.

Phosphor

As described above, the light transmissive member 3 may contain a phosphor. The phosphor may be a phosphor that is excitable by the light emitted from the light emitting elements 1. Examples of phosphors excitable by light emitted from a blue light emitting element or ultraviolet light emitting element include cerium-activated yttrium aluminum garnet-based phosphors (Ce:YAG); cerium-activated lutetium aluminum garnet-based phosphors (Ce:LAG); europium- and/or chromium-activated nitrogen-containing calcium aluminosilicate-based phosphors $(CaO.Al_2O_3.SiO_2)$; europium-activated silicate-based phosphors $((Sr,Ba)_2SiO_4)$; nitride-based phosphors, such as ß-SiAlON phosphors, CASN-based phosphors, SCASN-based phosphors; KSF-based phosphors $(K_2SiF_6:Mn)$; sulfide-base phosphors, and quantum dot phosphors. By combining these phosphors with a blue or ultraviolet light emitting element, light emitting devices of various emission colors (e.g., a white light emitting device) can be produced.

Light Reflecting Member 9

The light reflecting member 9 covers the lateral faces of the light emitting elements 1 and the lateral faces of the light transmissive member 3, reflecting the light exiting from the lateral faces of the light emitting elements 1 and the lateral faces of the light transmissive member 3 to release the light from the light emission surface. By providing the light reflecting member 9 covering the lateral faces of the light emitting elements 1 and the lateral faces of the light transmissive member 3 in this manner, light extraction efficiency can be increased. The light reflecting member 9, for example, can be formed with a light reflecting material having a high reflectance. Specifically, a light reflecting material having a reflectance of at least 60%, preferably at least 80% or 90%, relative to the light from the light emitting elements can be used for the light reflecting member 9. The light reflecting material, for example, is constructed with a resin containing a light reflecting substance.

For the base material of resin for constructing the light reflecting member 9, a silicone resin, modified silicone resin, epoxy resin, modified epoxy resin, acrylic resin, or a hybrid resin containing at least one of these resins can be used. The light reflecting member can be formed by having the base resin material contain a reflecting substance. Examples of the light reflecting substance include titanium dioxide, silicon oxide, zirconium oxide, magnesium oxide, yttrium oxide, yttria stabilized zirconia, calcium carbonate, calcium hydroxide, calcium silicate, niobium oxide, zinc oxide, barium titanate, potassium titanate, magnesium fluoride, alumina, aluminum nitride, boron nitride, mullite or the like. Preferably, titanium dioxide $(TiO_2)$ is used. Also preferably, particles of a light reflecting substance having a different refractive index from a refractive index of the base resin material are dispersed in the base resin. The amount of reflection and the amount of transmission vary depending on the concentration or density of the light reflecting substance contained. The concentration and density can suitably be adjusted in accordance with the shape or the size of the light emitting device. The light reflecting member 9 may contain other pigments, phosphors, or the like, in addition to the light reflecting substance.

Light Guide Member 13

In the light emitting device, as described above, the bonding between the light transmissive member 3 and the light emitting elements is achieved, for example, via the light guide member 13. The light guide member 13, as shown in FIG. 2, may cover the lateral faces of the light emitting elements 1 in whole or part. In the case in which a portion of the lower face of the light transmissive member 3 is not opposing the upper faces of the light emitting elements 1, which are primary light emission surfaces, the light guide member 13 is preferably formed to cover the portion of the lower face of the light transmissive member 3 that does not oppose the upper faces of the light emitting elements. The light guide member 13 is also interposed between the light emitting elements and the light transmissive member 3, bonding them together. The light guide member 13 constructed as above can efficiently guide the light emitted from the upper faces and the lateral faces of the light emitting elements 1 to the light transmissive member 3.

It is preferable to use a resin material for the light guide member 13 from the perspective of ease of handling and processing. Examples of the resin material include a resin containing one or more of silicone resins, modified silicone resins, epoxy resins, modified epoxy resins, acrylic resins, and fluoro-resins, a hybrid thereof, or the like can be used. The light guide member 13 can be formed to the shape described above by suitably adjusting the viscosity of the resin material for forming the light guide member 13, and the wettability of the light emitting elements 1 by the resin.

Other Members

The light emitting device may appropriately include other elements such as protective devices, electronic parts, and the like. These elements and electronic parts are preferably embedded in the light reflecting member 9.

Method of Manufacturing Light Emitting Device According to the Embodiment

The method of manufacturing a light emitting device according to the embodiment will be explained below with reference to the drawings.

Light Emitting Element Mounting Step

Figure 7A:
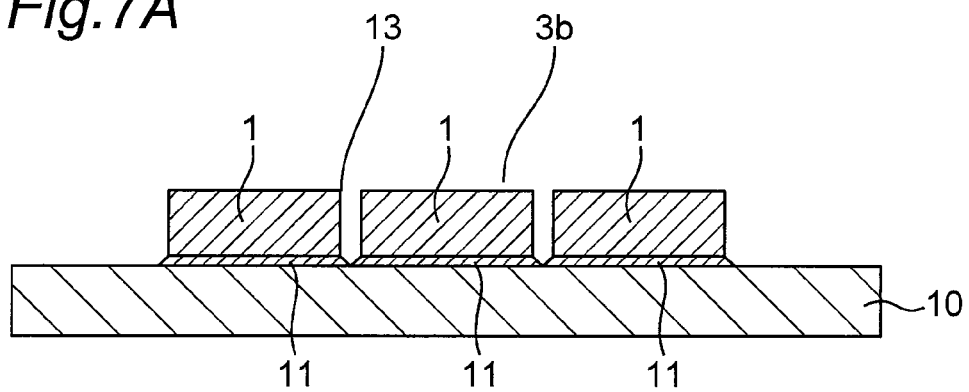
FIG. 7A is a cross-sectional view after light emitting elements are mounted in the method of manufacturing a light emitting device according to the embodiment.

As shown in FIG. 7A, the one or more light emitting elements 1 are flip-chip mounted on the substrate 10.

Specifically, for example, light emitting elements 1 having both the positive and negative electrodes on the lower faces are bonded by using conductive bonding members 11 so that the positive electrodes face the positive wires disposed on the substrate 10, and the negative electrodes face the negative wires disposed on the substrate 10. In FIGS. 7A to 7E, similar to FIG. 2, the illustrations are simplified without distinguishing the positive electrodes from the negative electrodes of the light emitting elements 1, or the positive wires from the negative wires disposed on the substrate 10.

Light Transmissive Member Bonding Step

Figure 7B:
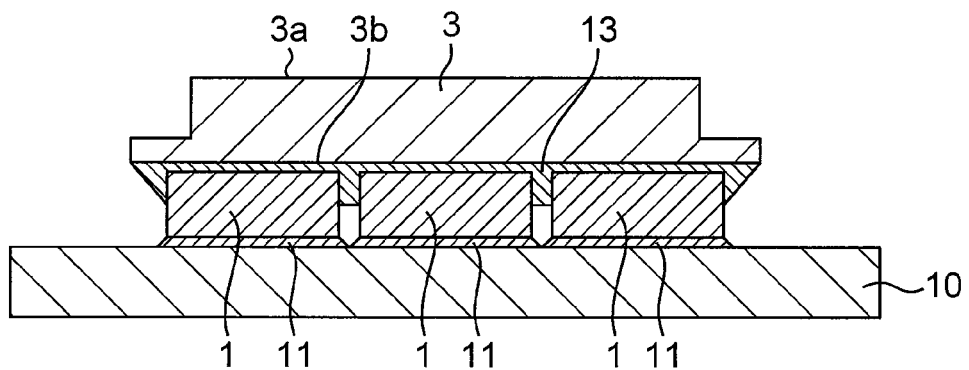
FIG. 7B is a cross-sectional view after a light transmissive member is bonded onto the mounted light emitting elements in the method of manufacturing a light emitting device according to the embodiment.

As shown in FIG. 7B, a plate-shaped light transmissive member is bonded so that the lower face thereof faces the light emission faces of the mounted light emitting elements 1.

First, for example, a plate-shaped light transmissive member 3 in which the lower face 3b of the light transmissive member 3 is larger than the upper face 3a of the light transmissive member 3 is provided.

Next, the prepared light transmissive member 3 is aligned with the light emitting elements 1, and the light transmissive member 3 is bonded to the light emission faces of the light emitting elements 1 using, for example, a light guide member 13.

The light transmissive member 3 is aligned so that, for example, (i) the outer perimeter of the lower face 3b of the light transmissive member 3 is positioned on or outward of the outer perimeter of the light emitting elements 1 in a plan view as seen from above, or (ii) the outer perimeter of the upper face 3a of the light transmissive member 3 is positioned on or inward of the outer perimeter of the light emitting elements 1 in a plan view as seen from above.

The light transmissive member 3 and the light emitting elements 1 may be bonded by placing on the light emitting elements 1 the light transmissive member 3 having a light guide member 13 applied to the lower face beforehand, or placing the light transmissive member 3 on the light emitting elements 1 after applying a coating of the light guide member 13 on the upper faces of the light emitting elements 1. The amount of the light guide member 13 applied, the load applied when pressing the light transmissive member 3 on the light emitting elements 1, the viscosity of the resin material if used as the light guide member 13, and the like can suitably be set by considering the desired shape to be held by the light guide member 13 subsequent to bonding the light transmissive member 3 to the light emitting elements 1.

Resin Wall Forming Step

Figure 7C:
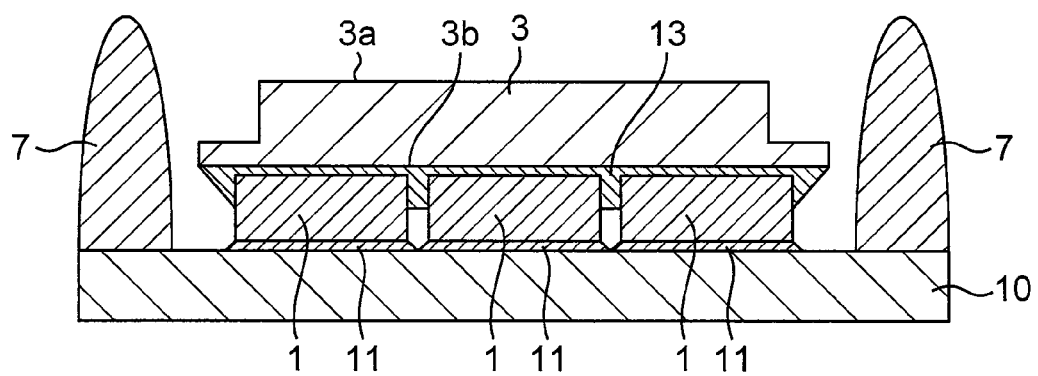
FIG. 7C is a cross-sectional view after resin walls are formed at a predetermined distance apart from the light emitting elements and the light transmissive member in the method of manufacturing a light emitting device according to the embodiment.

As shown in FIG. 7C, one or more resin walls 7 are formed by applying an uncured and/or semi-cured resin material on the substrate 10. The resin walls 7 are formed by using a resin material having the viscosity to allow the resin walls 7 to maintain their shapes while supporting the light shielding frame placed thereon. In this resin wall forming step, the resin walls 7 are not completely cured yet, forming the resin walls 7 while maintaining the flexibility to be deformed by pressing force.

As shown in FIG. 7C, the resin walls 7 are formed so that the upper ends are higher than the upper face of the light transmissive member 3 in the opposing locations at a prescribed distance apart from the light emitting elements 1 and the light transmissive member 3 while being interposed by the light emitting elements 1 and the light transmissive member 3. Here, the opposing locations interposed by the light emitting elements 1 and the light transmissive member 3 include not only the configuration in which two separated resin walls 7 are disposed to oppose one another, but also the case in which an annular resin wall 7 is formed where a portion of the annular resin wall 7 opposes another portion while being interposed by the light emitting elements 1 and the light transmissive member 3.

That is, the resin walls 7 may be formed in parallel to, and oppose, one another while being interposed by the light emitting elements 1 and the light transmissive member 3, or may be formed to surround the light emitting elements 1 and the light transmissive member 3. Moreover, the resin walls 7 may be arranged to straddle multiple light emitting devices, and specifically to straddle the dividing lines described later. Alternatively, the resin walls 7 may be formed in spots at positions that can support the light shielding frame.

For the resin walls 7, a resin material similar to that for the light reflecting member 9 described above, such as a silicone resin, modified silicone resin, epoxy resin, modified epoxy resin, acrylic resin, or hybrid resin containing one or more of these, can be used. The resin walls can be formed with a base material comprising these resins containing various fillers such as a light reflecting substance. The viscosity of the resin material can be adjusted, for example, by adjusting the amounts of fillers contained in the resin material.

The resin walls 7 are formed, for example, by positioning the nozzle of a resin discharging apparatus above the substrate 10, and allowing the nozzle to move along the resin wall forming regions while discharging an uncured resin material on the substrate 10 from the tip of the nozzle. The uncured resin material discharged from the nozzle wets and spreads on the substrate 10, and arranged on the substrate 10 as the resin walls 7 having substantially a semicircular cross-sectional shape. The resin walls may be formed by layering a plurality of resin walls, thereby forming resin walls having a desired height.

Light Shielding Frame Disposing Step

A light shielding frame 5 having an opening 5a is provided. The light shielding frame 5 is positioned and disposed to be fixed at a predetermined height from the substrate 10.

Figure 7D:
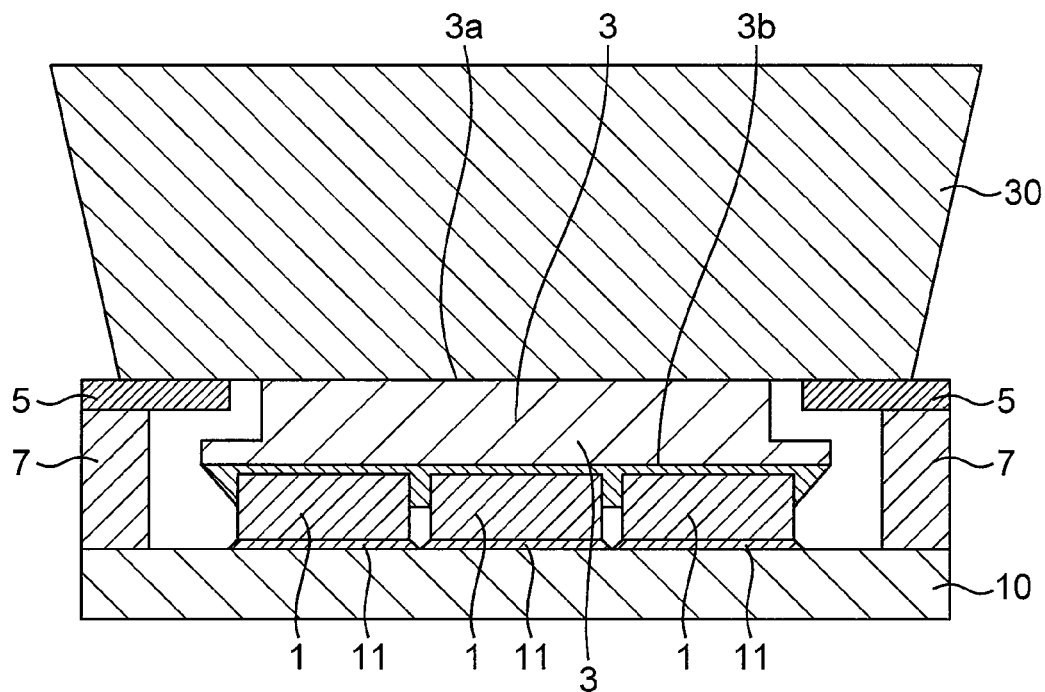
FIG. 7D is a cross-sectional view after a light shielding frame is disposed on the resin walls in the method of manufacturing a light emitting device according to the embodiment.

For example, the light shielding frame 5 is suctioned by using a suction collet 30, and positioned so that the inner perimeter of the opening 5a of the light shielding frame 5 is on or outward of the outer perimeter of the upper face of the light transmissive member before moving the suction collet 30 downward. Even after the upper face of the light shielding frame 5 comes into contact with the upper ends of the resin walls 7, as shown in FIG. 7D, the suction collet 30 is moved downward until the upper face of the light shielding frame 5 becomes coplanar with the upper face of the light transmissive member 3. In this manner, the light shielding frame 5 is positioned at a predetermined height from the substrate 10 by allowing the light shielding frame 5 to press down and deform the resin walls 7. Subsequently, the uncured resin material constructing the resin walls 7 is fully cured, thereby fixing the light shielding frame 5 at the predetermined height.

As described above, the uncured resin material used for forming the resin walls 7 is cured while supporting the light shielding frame 5 and being deformed by the light shielding frame 5 that is pressed down. This can fix the light shielding frame 5 at a predetermined height position, thereby attenuating height variance of the light emitting devices in the manufacturing process for the light emitting devices.

Here, FIG. 7D shows an example of positioning the light shielding frame in which the upper face of the light shielding frame 5 is substantially coplanar with the upper face of the light transmissive member 3.

However, in the light shielding frame disposing step, the light shielding frame 5 can be positioned so that the upper face of the light shielding frame 5 is positioned in a different plane from that of the upper face of the light transmissive member 3 as described below.

Figure 8:
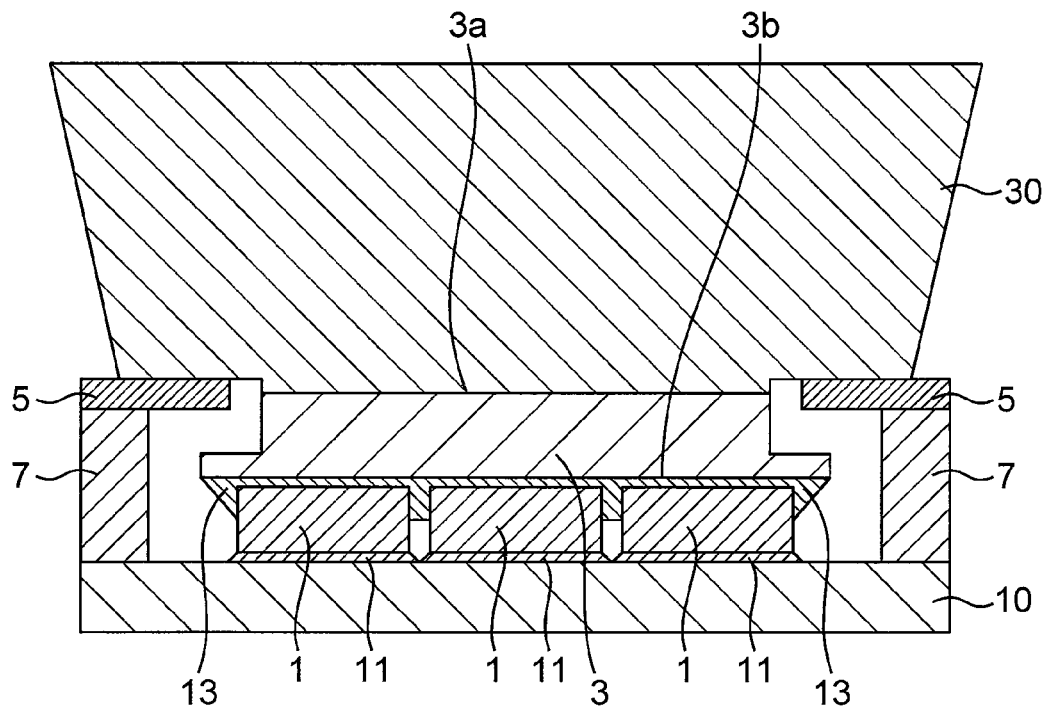
FIG. 8 is a cross-sectional view after disposing a light shielding frame on the resin walls so that the upper face of the light shielding frame is higher than the upper face of the light transmissive member in the method of manufacturing a light emitting device according to the embodiment.

In the case of positioning the light shielding frame 5 so that the upper face is higher than the upper face of the light transmissive member 3, as shown in FIG. 8 for example, the suction surface of the suction collet 30 is provided with a projected portion having an upper face that faces the upper face of the light transmissive member 3 in the location corresponding to the opening 5a of the light shielding frame 5, and the light shielding frame 5 is placed at a predetermined height from the substrate 10 by suctioning the light shielding frame at the peripheral portion of the suction face.

Figure 9:
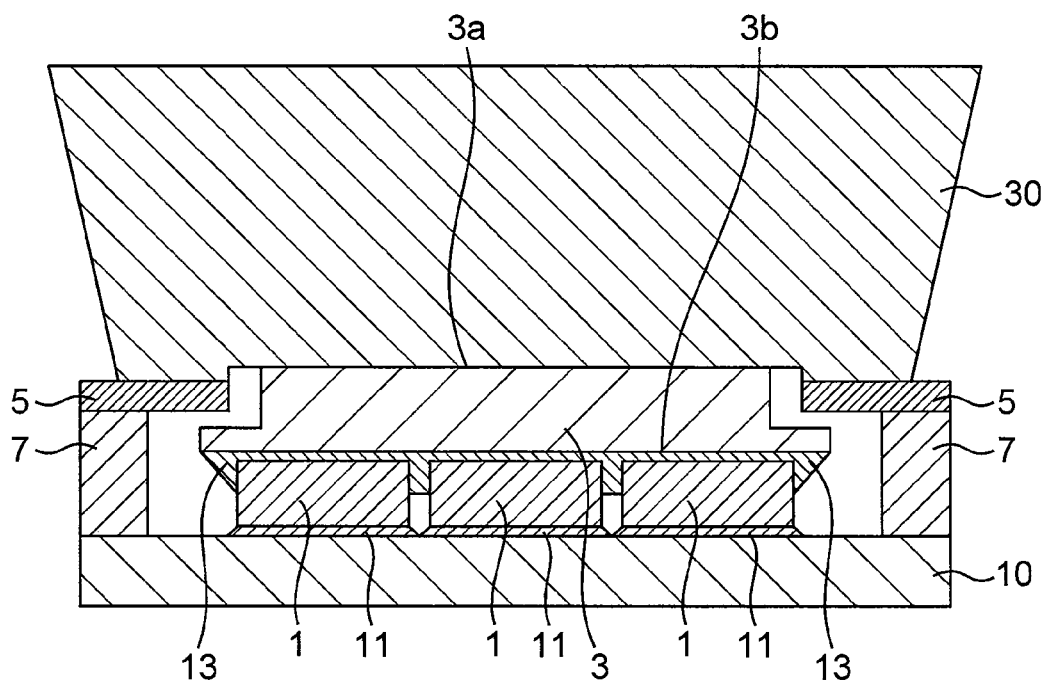
FIG. 9 is a cross-sectional view after disposing a light shielding frame on the resin walls so that the upper face of the light shielding frame is lower than the upper face of the light transmissive member in the method of manufacturing a light emitting device according to the embodiment.

In the case of positioning the light shielding frame 5 so that the upper face is lower than the upper face of the light transmissive member 3, as shown in FIG. 9 for example, the suction surface of the suction collet 30 is provided with a recessed portion having an upper face that faces the upper face of the light transmissive member 3 in the location corresponding to the opening 5a of the light shielding frame 5, and the light shielding frame 5 is placed at a predetermined height from the substrate 10 by suctioning the light shielding frame at the peripheral portion of the suction face.

Light Reflecting Member Forming Step

Figure 7E:
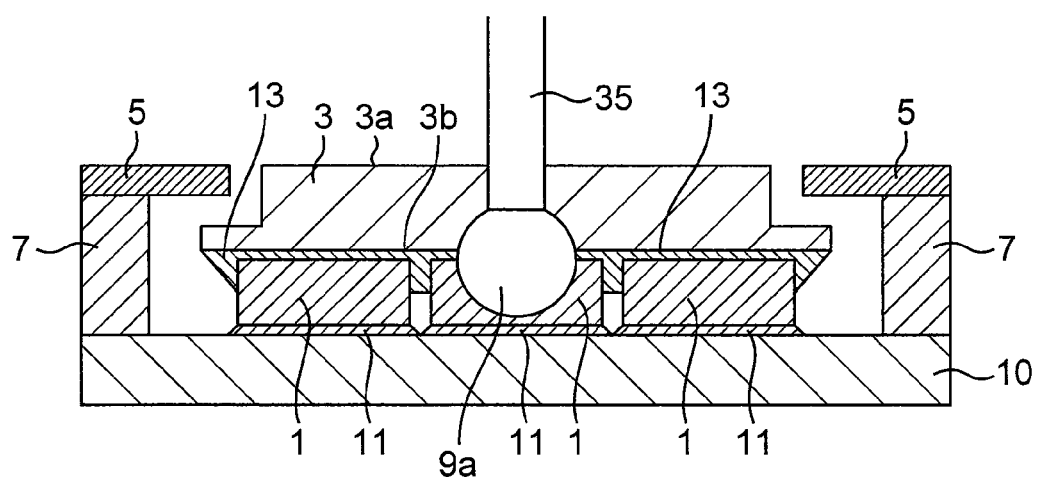
FIG. 7E is a cross-sectional view after supplying a light reflecting resin in the method of manufacturing a light emitting device according to the embodiment.

By supplying an uncured resin material for forming the light reflecting member into the space between the substrate 10 and the light shielding frame 5, a light reflecting member 9 that surrounds the light emitting elements 1 and the light transmissive member 3 between the substrate 10 and the light shielding frame 5 is formed. In the method of manufacturing a light emitting device according to the embodiment, a light shielding frame 5 having an depression 5b depressed inward at a portion of the outer perimeter in a plan view as seen from above is used, for example, and the light reflecting resin 9a is supplied into the space between the substrate 10 and the light shielding frame 5 via the depression 5b. Specifically, for example, a nozzle 35 of a resin discharging apparatus is inserted into the depression 5b of the light shielding frame 5, as shown in FIG. 7E, and the light reflecting resin 9a is supplied into the space between the substrate 10 and the light shielding frame 5 by discharging the light reflecting resin from the tip of the nozzle 35. In the case of supplying the light reflecting resin 9a into the space between the substrate 10 and the light shielding frame 5 via the depression 5b, it is preferable to form the depression 5b of the light shielding frame 5 at two locations, preferably two symmetrical locations as shown in FIG. 1. Forming the depression 5b at two locations in the light shielding frame 5 can easily reduce formation of voids, because when supplying the light reflecting resin 9a the space through one of the depressions 5b, air can be vented from the other depression 5b. Furthermore, because the inner perimeter of the opening of the light shielding frame 5 is at a distance apart from the outer perimeter of the upper face of the light transmissive member, air can be vented and the resin material being supplied can be visually observed.

After the light reflecting resin 9a is supplied into the space between the substrate 10 and the light shielding frame 5, the light reflecting resin supplied is cured.

The light emitting device according to the embodiment is produced as described above.

In the above explanations, schematics showing a single light emitting device were referenced.

However, in the method of manufacturing a light emitting device according to the embodiment, it is preferable to collectively provide a plurality of light emitting devices by using a substrate for the substrate 10 in which a plurality of unit regions are defined, each corresponding to individual light emitting devices, followed by separating it into individual light emitting devices.

For example, in the case of using a substrate that includes multiple rows (e.g., n rows) and multiple columns (e.g., m columns) of unit regions (e.g., n×m) as the substrate 10, the steps described below can be followed.

In the step of mounting the light emitting element, one or more light emitting elements 1 are mounted in each unit region. In the step of bonding the light transmissive member, a light transmissive member 3 is bonded for each unit region so as to collectively cover the one or more light emitting elements 1 mounted in each unit region.

In the step of forming the one or more resin walls, resin walls are formed for each unit region at the locations interposed by the one or more light emitting elements 1 and the light transmissive member 3.

In the case of using a substrate that includes multiple rows (e.g., n rows) and multiple columns (e.g., m columns) of unit regions (e.g., n×m) for the substrate 10, for example, by forming a plurality of resin walls parallel to one another in each column, the resin walls can be continuously formed for multiple unit regions arranged in the column direction, thereby efficiently forming the resin walls. In the step of forming the light reflecting member, a light reflecting resin for each unit region is supplied into the space between the substrate 10 and the light shielding frame 5.

In the step of dividing the substrate subsequent to the step of forming the light reflecting member, the light reflecting member and the substrate are divided into unit regions, in order to obtain individual light emitting devices. Such division can be achieved by cutting, for example, using a blade or the like.

Considering the division into unit regions, the dividing positions used for dividing into individual unit regions are preferably located apart from the outer perimeters of the light shielding frames 5. In other words, each light shielding frame 5 is preferably slightly smaller than the outer shape of each light emitting device.

According to the method of manufacturing a light emitting device described above, multiple light emitting devices are collectively manufactured on a substrate 10, which is subsequently divided into individual light emitting devices, thereby enabling manufacturing of light emitting devices in an inexpensive manner.

What is claimed is:

1. A light emitting device comprising:
a substrate;
a light emitting element disposed on the substrate;
a light transmissive member having a plate shape and having an upper face and a lower face disposed such that the lower face opposes a light emission face of the light emitting element;
a light reflecting member covering lateral faces of the light emitting element and lateral faces of the light transmissive member; and
a light shielding frame disposed on the upper face of the light reflecting member surrounding the light transmissive member;
wherein the light shielding frame has an opening, an inner perimeter of the opening is positioned at a distance apart from an outer perimeter of the upper face of the light transmissive member in a plan view as seen from above, and the light reflecting member is interposed between the inner perimeter of the opening and the outer perimeter of the upper face of the light transmissive member, and
wherein the upper face of the light transmissive member is substantially coplanar with an upper face of the light shielding frame.

2. The light emitting device according to claim 1, wherein the lower face of the light transmissive member is larger than the upper face of the light transmissive member, and an outer perimeter of the lower face of the light transmissive member is positioned outward of the inner perimeter of the opening in the plan view as seen from above.

3. The light emitting device according to claim 1, wherein the outer perimeter of the upper face of the light transmissive member is positioned on or inward of an outer perimeter of the light emitting element in the plan view as seen from above.

4. The light emitting device according to claim 1, wherein the outer perimeter of the light shielding frame is positioned on or inward of the outer perimeter of the light emitting device.

5. The light emitting device according to claim 1, wherein the light shielding frame is a metal frame comprising a metal that absorbs light, or a frame comprising a metal film that absorbs light at a surface of the frame.

6. The light emitting device according to claim 1, further comprising a resin wall, an upper end of the resin wall being in contact with a lower face of the light shielding frame, and being disposed on or outward of the light reflecting member.

7. The light emitting device according to claim 6, wherein the resin wall on the substrate supports the light shielding frame.

8. The light emitting device according to claim 7, wherein the lower face of the light shielding frame has a recess or protrusion.

9. The light emitting device according to claim 1, wherein a depression is located at a portion of the outer perimeter of the light shielding frame, and an upper face of the light reflecting member is exposed at the depression.

10. The light emitting device according to claim 1, wherein the light transmissive member contains at least one phosphor.

11. A method of manufacturing a light emitting device, the method comprising:
    mounting a light emitting element on a substrate,
    bonding a light transmissive member having a plate shape such that a lower face of the light transmissive member faces a light emission face of the mounted light emitting element;
    forming a resin wall having an upper end higher than an upper face of the light transmissive member in locations at a predetermined distance apart from the light emitting element and the light transmissive member and interposed by the light emitting element and the light transmissive member while being deformable by a pressing force;
    disposing a light shielding frame having an opening at a predetermined height from the substrate by pressing the light shielding frame to be in contact with the upper end of the resin wall such that an inner perimeter of the opening is positioned on or outward of the outer perimeter of the upper face of the light transmissive member; and
    forming a light reflecting member that surrounds the light emitting element and the light transmissive member between the substrate and the light shielding frame by supplying a light reflecting resin into a space between the substrate and the light shielding frame.

12. The method of manufacturing a light emitting device according to claim 11, wherein:
    the substrate includes a plurality of unit regions;
    in the step of mounting the light emitting element, one or more light emitting elements are mounted in each unit region;
    in the step of bonding the light transmissive member, the light transmissive member is bonded in such a manner as to collectively cover the one or more light emitting elements mounted in each unit region;
    in the step of forming the resin wall, one or more of the resin walls are formed per unit region such that the one or more resin walls are interposed by the one or more light emitting elements and the light transmissive member located in each unit region;
    in the step of forming the light reflecting member, the light reflecting member is supplied into the space between the substrate and the light shielding frame in each unit region; and
    the method further comprises dividing the substrate into individual unit regions subsequent to the step of forming the light reflecting member.

13. The method of manufacturing a light emitting device according to claim 11, wherein:
    the lower face of the light transmissive member is larger than the upper face of the light transmissive member; and
    in the step of disposing the light shielding frame, the light shielding frame is pressed into contact with the upper ends of the one or more resin walls such that the inner perimeter of the opening is positioned on or outward of the outer perimeter of the upper face of the light transmissive member, and the outer perimeter of the lower face of the light transmissive member is positioned on or outward of the inner perimeter of the opening in a plan view as seen from above.

14. The method of manufacturing a light emitting device according to claim 11, wherein, in the step of bonding the light transmissive member, the light transmissive member is bonded such that the outer perimeter of the upper face of the light transmissive member is positioned on or inward of the outer perimeter of the light emitting element in a plan view as seen from above.

15. The method of manufacturing a light emitting device according to claim 11, wherein, in the step of disposing the light shielding frame, the light shielding frame is positioned such that an upper face of the light shielding frame is substantially coplanar with the upper face of the light transmissive member.

16. The method of manufacturing a light emitting device according to claim 11, wherein, in the step of disposing the light shielding frame, the light shielding frame is positioned such that an upper face of the light shielding frame is positioned in a different plane from the upper face of the light transmissive member.

17. The method of manufacturing a light emitting device according to claim 11, wherein the light shielding frame has an depression at a portion of the outer perimeter in a plan view, and, in the step of forming the light reflecting member, the light reflecting resin is supplied into the space between the substrate and the light shielding frame via the depression.

\* \* \* \* \*